United States Patent
Asaoka et al.

(10) Patent No.: US 8,459,782 B2
(45) Date of Patent: Jun. 11, 2013

(54) LIQUID EJECTING HEAD, LIQUID EJECTING APPARATUS, AND PIEZOELECTRIC ELEMENT

(75) Inventors: Ichiro Asaoka, Chino (JP); Jiro Kato, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 249 days.

(21) Appl. No.: 12/885,170

(22) Filed: Sep. 17, 2010

(65) Prior Publication Data

US 2011/0069124 A1    Mar. 24, 2011

(30) Foreign Application Priority Data

Sep. 18, 2009  (JP) .................................. 2009-217861

(51) Int. Cl.
*B41J 2/045* (2006.01)

(52) U.S. Cl.
USPC .......................................................... 347/71

(58) Field of Classification Search
USPC .......................................................... 347/71
See application file for complete search history.

(56) References Cited

U.S. PATENT DOCUMENTS

| 6,494,567 B2 | 12/2002 | Murai |
| 2002/0180843 A1* | 12/2002 | Irie et al. ........................ 347/70 |
| 2008/0024563 A1* | 1/2008 | Matsui et al. ................... 347/70 |

FOREIGN PATENT DOCUMENTS

JP    2001-274472    10/2001

* cited by examiner

*Primary Examiner* — Kevin S Wood
(74) *Attorney, Agent, or Firm* — Workman Nydegger

(57) ABSTRACT

A liquid ejecting head having pressure chambers each communicating with a nozzle opening for liquid ejection and piezoelectric element having a first electrode, a piezoelectric layer consisting a perovskite oxide containing lead, zirconium, and titanium, and a second electrode. The piezoelectric layer has a carbon intensity ratio in the range of 8 to 28 in its inner region excluding the volume 20 nm in depth from the second electrodes. The carbon intensity ratio is defined as the ratio of the maximum carbon intensity to the minimum as measured by secondary ion mass spectrometry along the thickness of the piezoelectric layer.

7 Claims, 10 Drawing Sheets

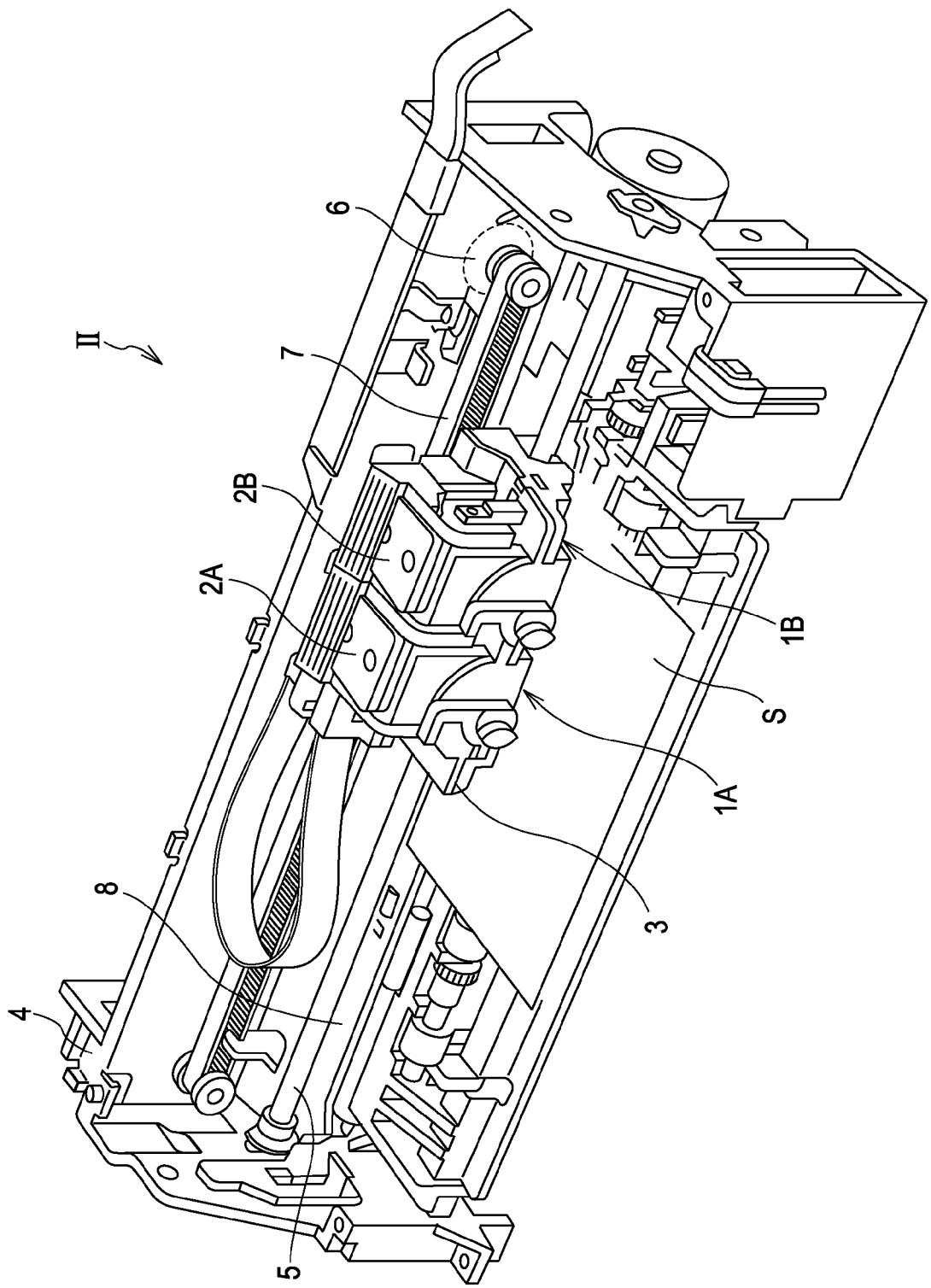

LIQUID EJECTING HEAD, LIQUID EJECTING APPARATUS, AND PIEZOELECTRIC ELEMENT

CROSS-REFERENCE TO RELATED APPLICATIONS

This application claims the benefit of priority to Japanese Patent Application No. 2009-217861 filed Sep. 18, 2009, the contents of which are hereby incorporated by reference in their entirety.

BACKGROUND

1. Technical Field

The present invention relates to a liquid ejecting head, liquid ejecting apparatus, and a piezoelectric element.

2. Related Art

Ink jet recording heads are now in practical use. In an ink jet recording head, a diaphragm serves as a part of each pressure chamber, which communicates with a nozzle opening for ejecting ink droplets, and this diaphragm is deformed by a piezoelectric element so that the ink contained in the pressure chamber can be pressurized, thereby allowing ink droplets to be ejected from the nozzle opening. A typical ink jet recording head is one in which the surface of each diaphragm is completely covered with a uniform piezoelectric layer by film formation, and this piezoelectric layer is patterned by lithography to fit pressure chambers, so that the individual pressure chambers have their own piezoelectric element (see JP-A-2001-274472).

The piezoelectric layer used in the piezoelectric element described in JP-A-2001-274472 provides any desired displacement property (the degree of displacement); however, ink jet recording heads are now required to have piezoelectric elements with a better displacement property for more improved ejection properties.

Besides ink jet recording heads, other types of liquid ejecting heads also have a similar problem.

SUMMARY

An advantage of some aspects of the invention is that a liquid ejecting head and a liquid ejecting apparatus can be provided with good ejection properties and that a piezoelectric element can be provided with good piezoelectric properties.

A liquid ejecting head according to an aspect of the invention has pressure chambers each communicating with a nozzle opening for liquid ejection and piezoelectric elements each having a first electrode, a piezoelectric layer formed on the first electrode from a perovskite oxide containing lead, zirconium, and titanium, and second electrodes formed on the piezoelectric layer to cover the areas above the first electrode. The piezoelectric layer has a carbon intensity ratio, which is defined as the ratio of the maximum carbon intensity to the minimum as measured by secondary ion mass spectrometry along the thickness of the layer, in the range of 8 to 28 in its inner region excluding the volume 20 nm in depth from the second electrodes. The carbon intensity ratio being equal to or higher than 8 leads to an increased relative dielectric constant, and the piezoelectric coefficient is accordingly improved, bringing about an increased degree of displacement. However, any carbon intensity ratio of higher than 28 causes carbon atoms constituting crystals existing in the piezoelectric layer to push out the film structure of the layer, resulting in a greater stress applied to the inside of the film; thus, the carbon intensity ratio should not be higher than 28. In this way, this liquid ejecting head has good ejection properties.

Preferable embodiments of this aspect of the invention include one in which the maximum carbon intensity is found at a depth close to the first electrode with respect to the thickness of the piezoelectric layer, whereas the minimum at a depth close to the second electrodes, and one in which the piezoelectric layer is formed by the sol-gel method.

A liquid ejecting apparatus according to another aspect of the invention has any form of the liquid ejecting heads described above; this allows the liquid ejecting apparatus to have good ejection properties.

A piezoelectric element according to another aspect of the invention has a first electrode, a piezoelectric element formed on the first electrode from a perovskite oxide containing lead, zirconium, and titanium, and a second electrode formed on the piezoelectric layer. The piezoelectric layer has a carbon intensity ratio (defined above) in the range of 8 to 28 in its inner region excluding the volume 20 nm in thickness from the second electrode. The carbon intensity ratio being in the range of 8 to 28 leads to an increased dielectric constant of the piezoelectric layer, resulting in improved displacement properties.

BRIEF DESCRIPTION OF THE DRAWINGS

The invention will be described with reference to the accompanying drawings, wherein like numbers reference like elements.

FIG. 10 shows a perspective view of a liquid ejecting apparatus according to an aspect of the invention.

DESCRIPTION OF EXEMPLARY EMBODIMENTS

Ink Jet Recording Head

The following describes an ink jet recording head, a typical form of liquid ejecting heads according to an aspect of the invention.

Figure 1:
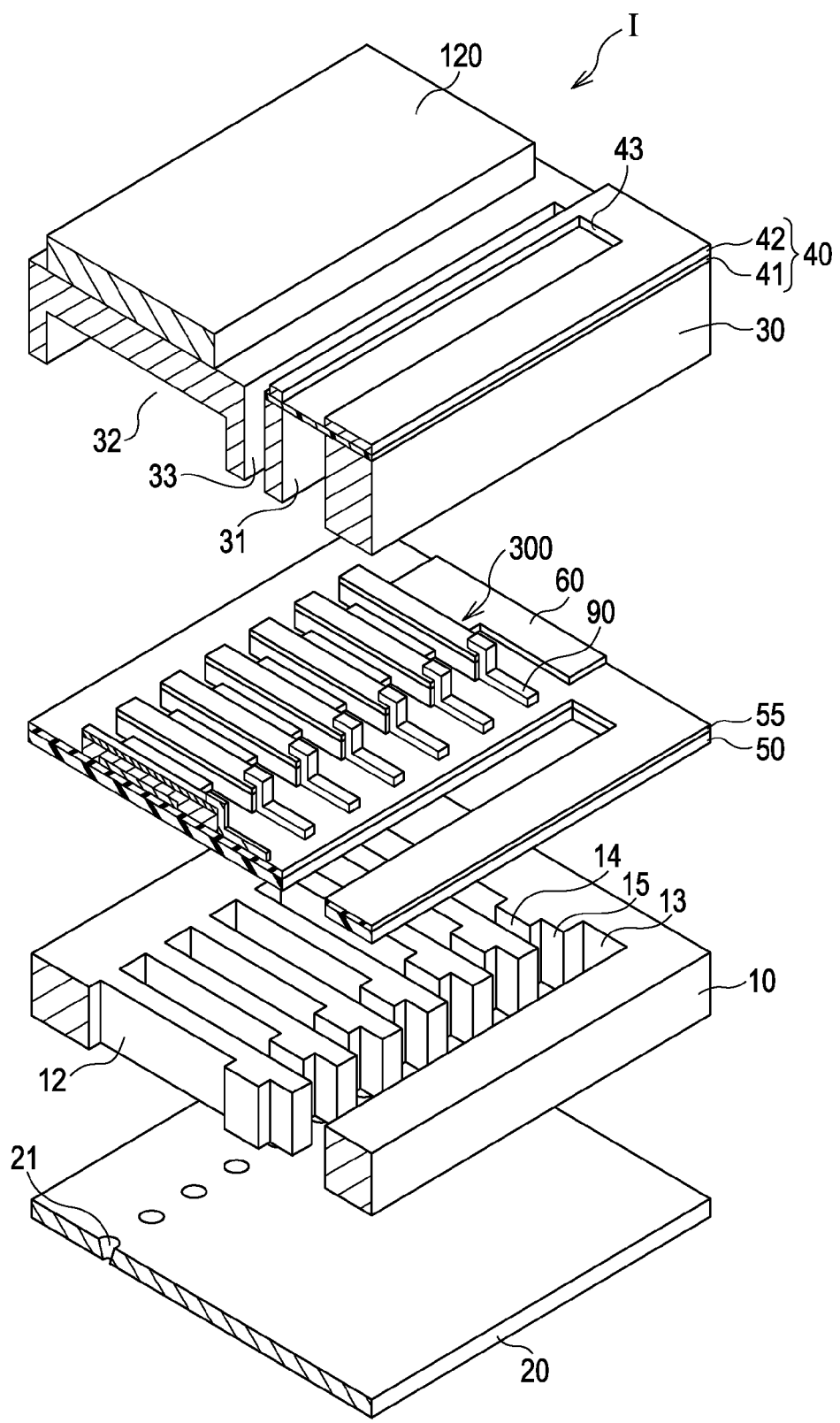
FIG. 1 shows an exploded perspective schematic view of a recording head according to an aspect of the invention.
Figure 2A:
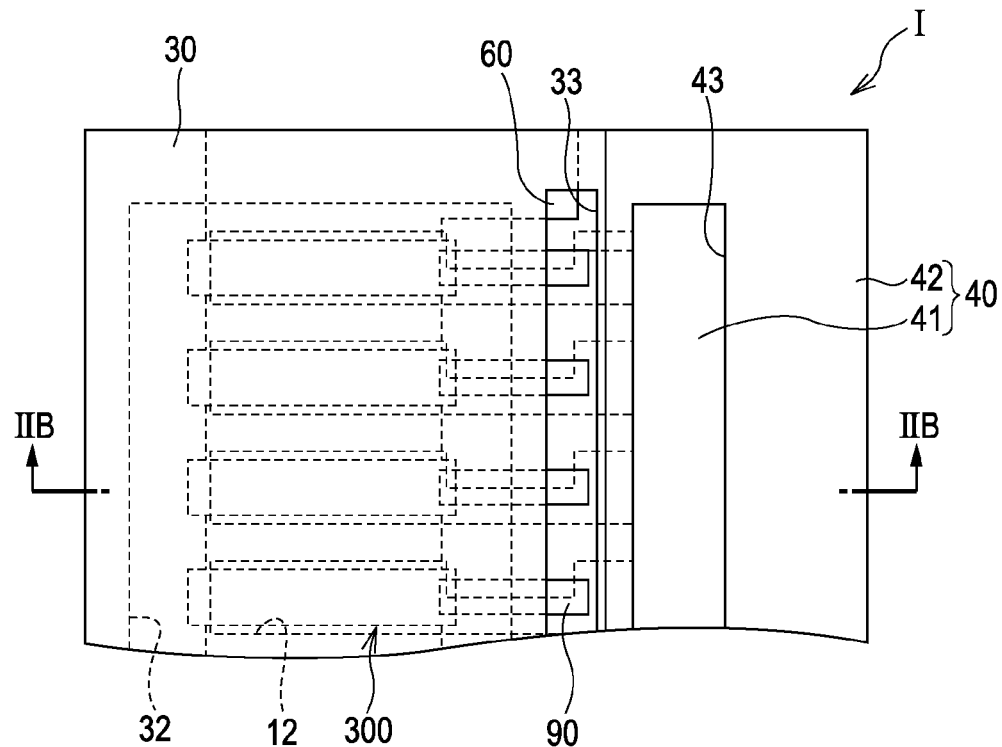
FIGS. 2A and 2B show a plan view and a cross-sectional view, respectively, of a recording head according to an aspect of the invention.
Figure 2B:
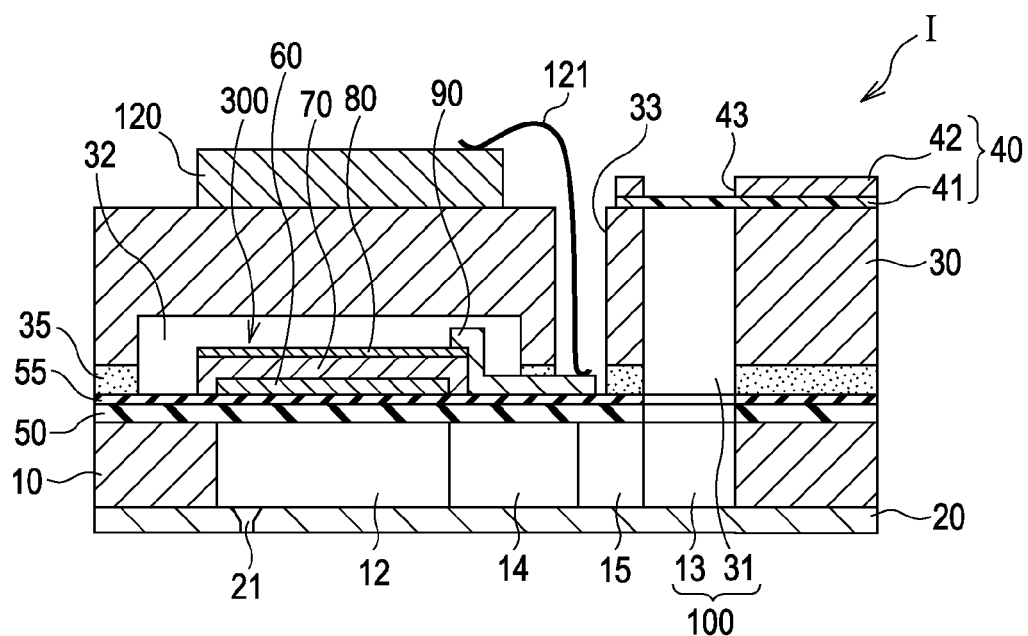

FIG. 1 shows an exploded perspective schematic view of an ink jet recording head according to Embodiment 1 of the invention. FIG. 2A shows a plan view of FIG. 1, and FIG. 2B a cross section taken along line IIB-IIB.

As shown in the drawings, a flow channel substrate 10 has a surface covered with an elastic film 50. The flow channel substrate 10 is a silicon single crystal substrate, and the elastic film 50 is made of silicon dioxide.

On the flow channel substrate 10, pressure chambers 12 are arranged in parallel in the width direction thereof. One of the two volumes expanding along the longitudinal ends of the pressure chambers 12 has a communicating space 13, which communicates with the pressure chambers 12 through ink supply paths 14 and communicating paths 15 formed in series next to the individual pressure chambers 12. Communicating with a reservoir space 31 of the protective substrate described later, the communicating space 13 serves as a component of a reservoir, a common ink tank for the pressure chambers 12. The ink supply paths 14 are narrower than the pressure chambers 12 and keep constant the flow resistance of ink flowing from the communicating space 13 into the pressure chambers 12.

The opening side of the flow channel substrate 10 is bonded to a nozzle plate 20 with an adhesive agent, a heat-seal film, or the like. The nozzle plate 20 has nozzle openings 21 formed to communicate with the pressure chambers 12 at positions close to the ends of the pressure chambers 12 opposite to those in contact with the ink supply paths 14; the nozzle plate 20 is made of a glass ceramic, a silicon single crystal, stainless steel, or the like.

As described above, the other side of the flow channel substrate 10 is coated with the elastic film 50, on which an insulating film 55 is formed. This insulating film 55 retains piezoelectric elements 300 arranged thereon, each of which is a laminate of a first electrode 60, a piezoelectric layer 70, and a second electrode 80 layered by the process described later. Usually, one of the two electrodes of each piezoelectric element 300 serves as a common electrode for the piezoelectric elements 300, and the remaining electrode and the piezoelectric layer 70 are patterned to fit the pressure chambers 12. In this embodiment, the first electrode 60 serves as a common electrode for the piezoelectric elements 300, whereas the second electrodes 80 serve as separate electrodes for the piezoelectric elements 300; however, this assignment may be reversed if so required by the circumstances of the driving circuit and/or wires involved. Note that in the above-described configuration, the elastic film 50, the insulating film 55, and the first electrode 60 collectively provide diaphragms; however, of course, the diaphragm configuration is never limited to this. For example, the diaphragms may be provided solely by the first electrode 60 with no elastic film 50 or insulating film 55 used, or the piezoelectric elements 300 themselves may serve as the diaphragms.

The piezoelectric layer 70, which is formed on the first electrode 60, is made of a piezoelectric material that functions as an electromechanical transducer and contains at least Pb, Ti, and Zr, and can be obtained by layering piezoelectric crystalline films each containing perovskite-structured crystals. Suitable materials for the piezoelectric layer 70 include lead zirconate titanate (PZT) and other similar piezoelectric (ferroelectric) materials as well as derivatives obtained by adding niobium oxide, nickel oxide, magnesium oxide, or some other metal oxide to such materials. Other acceptable materials include lead lanthanum zirconate titanate ((Pb,La)(Zr,Ti)O$_3$), lead zirconium titanate magnesium niobate (Pb(Zr,Ti)(Mg,Nb)O$_3$), and so forth. Such materials as above may further contain tungsten (W), sodium (Na), potassium (K), and/or other additives. In this embodiment, PZT is used. Incidentally, the thickness of the piezoelectric layer 70 is small enough to prevent cracks during the manufacturing process and large enough to ensure an adequate displacement property; for example, the thickness is in the range of 0.1 to 5 μm.

The piezoelectric layer 70 used in this embodiment contains carbon atoms at different concentrations, as measured by secondary ion mass spectrometry along the thickness thereof, in its inner region excluding the volume potentially affected by the knock-on of surface contamination or by surface effects (the volume about 20 nm in depth from the second electrodes 80). These carbon atoms originate from the raw materials of the piezoelectric layer 70, from which the carbon atoms carried over after the layer is formed by MOCVD, the sol-gel method, or the like; for example, in the sol-gel method, alcohol as a solvent, a viscosity modifier, ligands of raw material alkoxide or the like, and other carbon-containing components of the raw material solution may leave such carbon atoms. In this embodiment, these residual carbon atoms are more in quantity at depths closer to the first electrode 60 than at depths closer to the second electrodes 80. In other words, secondary ion mass spectrometry finds the maximum carbon intensity at a depth close to the first electrode 60, compared with the middle of thickness, and the minimum at a depth close to the second electrodes 80. Note that in this embodiment, the individual piezoelectric films have the same thickness, and thus the above-described distribution of the maximum and minimum carbon intensities is ensured; piezoelectric films with different thicknesses or some other similar case may give a different distribution.

In this embodiment, the carbon intensity ratio, namely, the ratio of the maximum carbon intensity, found at a depth closer to the first electrode 60, to the minimum, found at a depth closer to the second electrodes 80, is not lower than 8. This increases the dielectric constant (to about 1170 or higher as described later in Examples), and the piezoelectric coefficient is improved accordingly. An equation for the piezoelectric constant, d, is as follows: $d=2Q\epsilon_o\epsilon_r P_s$, where Q represents the electrostriction coefficient, $\epsilon_o$ the dielectric constant in vacuum, $\epsilon_r$ the relative dielectric constant, and $P_s$ the coefficient of spontaneous polarization. As can be seen from this equation, the piezoelectric coefficient d is proportional to the relative dielectric constant $\epsilon_r$; a carbon intensity ratio equal to or higher than 8 as seen in this embodiment leads to an increased relative dielectric constant $\epsilon_r$, thereby resulting in an improved piezoelectric coefficient d, so that the displacement property can be improved.

Preferably, the carbon intensity ratio is equal to or higher than 10, and not higher than 28. A carbon intensity ratio equal to or lower than 28 ensures that the stress emerging in the individual piezoelectric films is reduced.

Incidentally, each of the second electrodes 80, separate electrodes for the piezoelectric elements 300, is connected to a lead electrode 90. Each lead electrode 90 is made of gold (Au) or some other similar material and extends from the vicinity of one end of each second electrode 80 near the corresponding ink supply path 14, running over the insulating film 55.

The flow channel substrate 10 on which the above-described piezoelectric elements 300 are formed, or the unit composed of the first electrode 60, the insulating film 55, and lead electrodes 90, is covered with a protective substrate 30 bonded thereto via an adhesive agent 35. The protective substrate 30 has a reservoir space 31, which serves as at least a component of a reservoir 100. In this embodiment, the reservoir space 31 penetrates the entire thickness of the protective substrate 30 and extends in the width direction of the pressure chambers 12; as described above, the reservoir space 31 communicates with the communicating space 13 of the flow channel substrate 10, thereby serving as a component of the reservoir 100, a common ink tank for the pressure chambers 12.

The protective substrate 30 further has a piezoelectric element housing 32 on the side thereof facing the piezoelectric elements 300. The piezoelectric element housing 32 should have a capacity large enough to allow the piezoelectric elements 300 to move freely, and may be sealed or unsealed.

The material for the protection substrate 30 is preferably one having a coefficient of thermal expansion almost equal to that of the flow channel substrate 10, for example, a glass material or a ceramic material. In this embodiment, the protection substrate 30 is a silicon single crystal substrate as with the flow channel substrate 10.

The protection substrate 30 further has a through hole 33, which penetrates the entire thickness of the protective substrate 30. The individual lead electrodes 90, extending from their corresponding piezoelectric elements 300, have a portion exposed in the through hole 33 near either end thereof.

The protective substrate 30 further has a driving circuit 120 fixed thereon for driving the piezoelectric elements 300. Examples of the driving circuit 120 include a circuit substrate, a semiconductor integrated circuit (IC), and so forth. The driving circuit 120 is electrically connected to the lead electrodes 90 via wiring 121 consisting of conductive bonding wires or the like.

The protective substrate 30 further has a compliance substrate 40 attached thereto, and the compliance substrate 40 consists of a sealing film 41 and a stationary plate 42. The sealing film 41 is made of a flexible material with a low rigidity and seals either opening of the reservoir space 31, whereas the stationary plate 42 is made of a harder material and has an opening 43 penetrating the entire thickness thereof over the area in contact with the reservoir 100. Thus, either opening of the reservoir 100 is sealed only with the sealing film 41, a flexible material.

An ink jet recording head according to this embodiment receives ink from an external ink source (not shown in the drawings) via an ink inlet connected to the ink source, fills the entire space from the reservoir 100 to the nozzle openings 21 with ink, and then, in response to recording signals transmitted from the driving circuit 120, applies voltage to the first electrode 60 and the second electrode 80 of each pressure chamber 12, so that the elastic film 50, the insulating film 55, the first electrode 60, and the piezoelectric layer 70 can be deformed to bend; as a result, the pressure chambers 12 are pressurized to eject ink droplets through the nozzle openings 21.

Manufacturing Method of Ink Jet Recording Heads

The following describes a method for manufacturing such ink jet recording heads as that described above with reference to FIGS. 3 to 7. FIGS. 3 to 7 individually include cross-sectional diagrams illustrating this method.

Figure 3A:
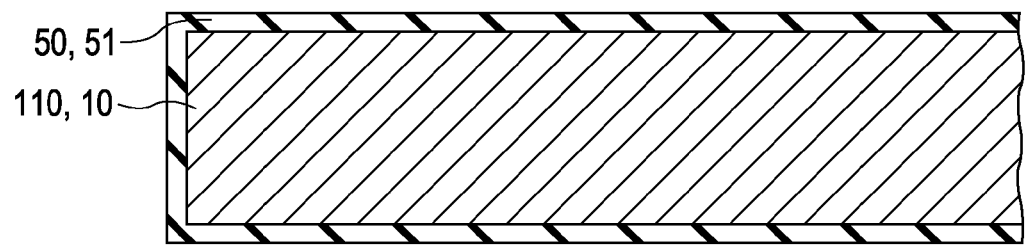
FIGS. 3A to 3C, 4A to 4C, 5A to 5C, 6A to 6C, and 7 are cross-sectional diagrams illustrating a method for manufacturing a recording head according to an aspect of the invention.
Figure 3B:
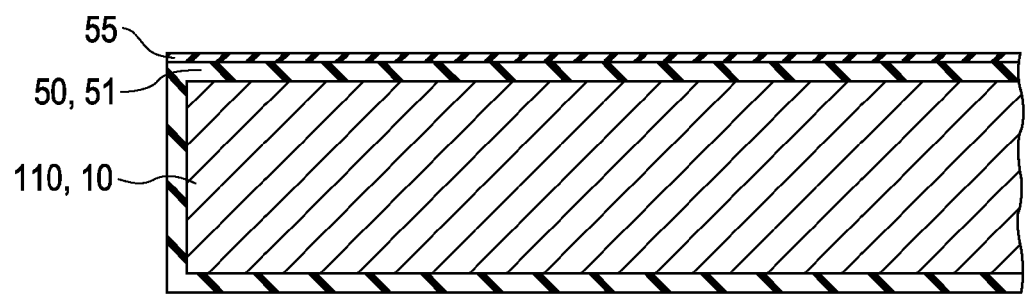

First, as shown in FIG. 3A, a silicon dioxide film 51 is formed from silicon dioxide ($SiO_2$) so that a flow channel substrate wafer 110 is completely wrapped therewith. The flow channel substrate wafer 110 is a silicon wafer from which flow channel substrates 10 are produced, and the silicon dioxide film 51 is the base for an elastic film 50. Then, as shown in FIG. 3B, a zirconium (Zr) layer is formed on a surface of the elastic film 50 (the silicon dioxide film 51) and then processed into zirconium oxide ($ZrO_2$) by thermal oxidation or the like to form an insulating film 55.

Figure 3C:
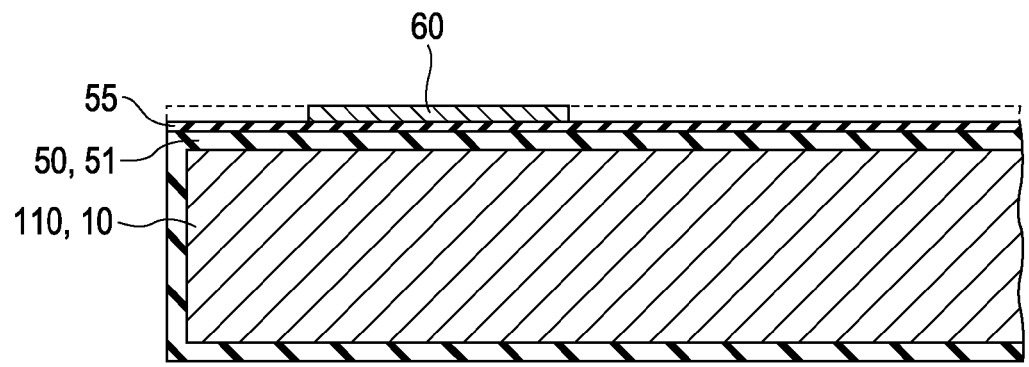

Then, as shown in FIG. 3C, a first electrode 60 is formed to cover the surface of the insulating film 55 completely, and then patterned by ion milling or some other dry etching process. Considering that a piezoelectric layer 70 is formed from PZT later, the material for this first electrode 60 is preferably one that would experience little change in conductivity upon the diffusion of lead oxide; suitable examples of such a material include platinum, iridium, and so forth. Examples of the methods for forming the first electrode 60 include sputtering, PVD (physical vapor deposition), and so forth.

Then, a piezoelectric layer 70 is formed from PZT on the surface of the flow channel substrate wafer 110 on which the first electrode 60 exists. In this embodiment, a metal-oxide-based piezoelectric layer 70 is formed by the sol-gel method, in which a metal organic compound is dissolved or dispersed in a solvent or a mixture of solvents, the resultant sol (coating solution) is applied and dried, and then the resultant gel is baked at a high temperature. The piezoelectric layer 70 may be formed by some other method such as metal-organic decomposition (MOD); however, the sol-gel method is the most preferable.

Figure 4A:
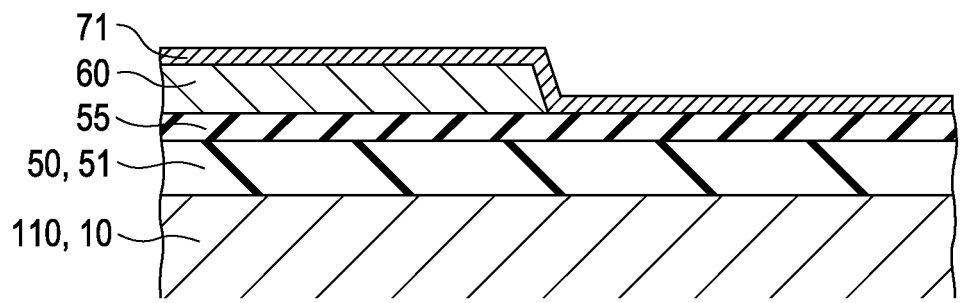

Specific processes for forming the piezoelectric layer 70 are as follows. First, as shown in FIG. 4A, a piezoelectric precursor film 71 is formed on the first electrode 60; in other words, a sol (solution) containing a metal organic compound is applied to the flow channel substrate 10, on which the first electrode 60 is formed in advance (applying). Then, the piezoelectric precursor film 71 is dried at a given temperature for a certain period (drying). Drying according to this embodiment consists of two phases. The first drying phase is for allowing the main solvent (in this embodiment, butyl cellosolve) to evaporate, whereas the second drying phase is for allowing the remaining solvent(s), not bound to metal molecules (in this embodiment, acetylacetonate, diethanolamine, and/or other solvent[s]), to evaporate. A preferable setting for the first drying phase is as follows: the solution applied is maintained at a temperature in the range of 80 to 140° C. for a period in the range of 1 to 7 minutes. A preferable setting for the second drying phase is as follows: the coating obtained is maintained at a temperature 20 to 120° C. lower than the decomposition temperature of the original solution for precursor films, $T_m$, for a period in the range of 1 to 7 minutes. These settings ensure that the carbon atoms are dispersed in the piezoelectric layer 70 so that the carbon intensity ratio can be equal to or higher than 8, thereby allowing the piezoelectric layer 70 to have a desired relative dielectric constant. The decomposition temperature $T_m$ can be measured by thermogravimetry; more specifically, the solution applied is weighed under heating by thermogravimetry, and then, after the highest one of the evaporation temperatures of the solvents is reached, the temperature at which the greatest decrease in the weight of the solution is detected is recorded as $T_m$.

Then, the piezoelectric precursor film 71 dried is maintained at a given temperature until fat is completely removed (defatting). For example, in an example of the invention, the piezoelectric precursor film 71 was maintained at a temperature on the order of 300 to 400° C. for a period on the order of 3 to 10 minutes. Note that the term "defatting" used here represents removing organic substances from the piezoelectric precursor film 71 by converting them into $NO_2$, $CO_2$, $H_2O$, or some other species.

Figure 4B:
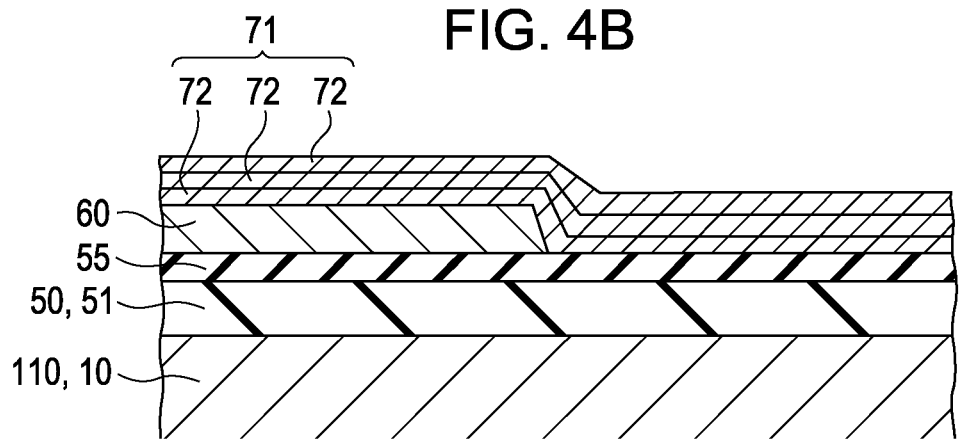

Then, this precursor film formation cycle, which consists of applying, drying, and defatting, is repeated until additional piezoelectric precursor films 71 are formed as shown in FIG. 4B (in the drawing, three films in total). The obtained piezoelectric precursor films 71 are heated by an infrared heater to a given temperature and maintained at the temperature until crystallization to form piezoelectric films 72. In other words, the piezoelectric precursor films 71 are baked all together to form the piezoelectric films 72 (batch baking).

A preferable setting for this style of batch baking, in which an infrared heater is used, is as follows: the piezoelectric precursor films 71 are heated at a temperature in the range of 700 to 760° C.

Figure 4C:
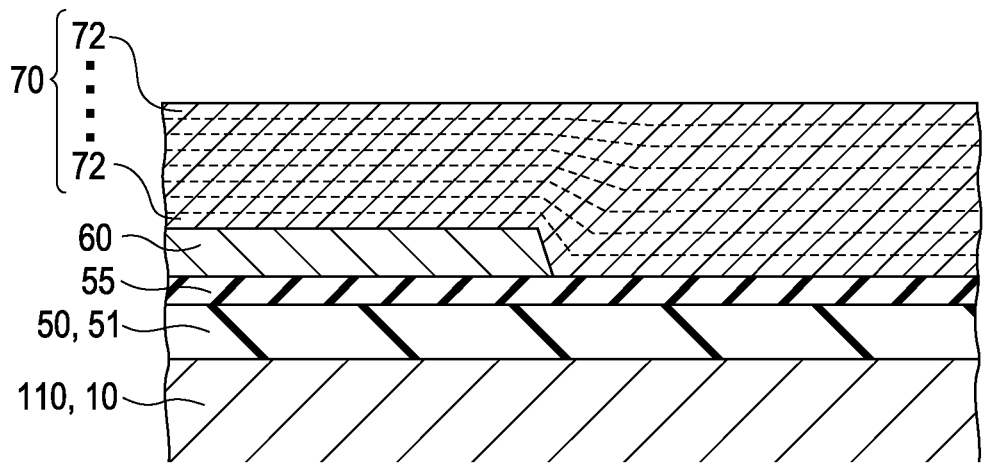

This routine, which consists of some cycles of precursor film formation and subsequent batch baking, is repeated until the resultant piezoelectric layer 70, which is organized by piezoelectric films 72, has a given thickness as shown in FIG. 4C. For example, in an example of an aspect of the invention, a routine consisting of three cycles of precursor film formation and subsequent batch baking was repeated three times, and then two piezoelectric precursor films 71 were formed and baked together; as a result, a piezoelectric layer 70 having a total thickness of about 1330 nm was obtained by application repeated 11 times in total.

Figure 5A:
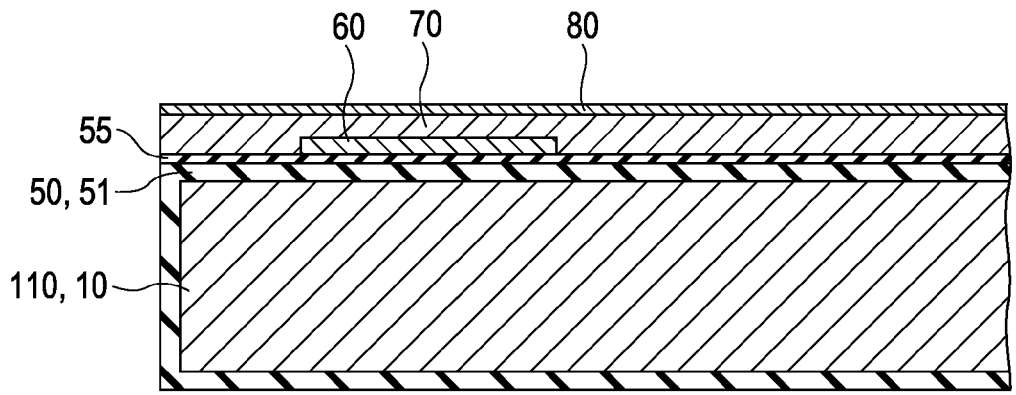
Figure 5B:
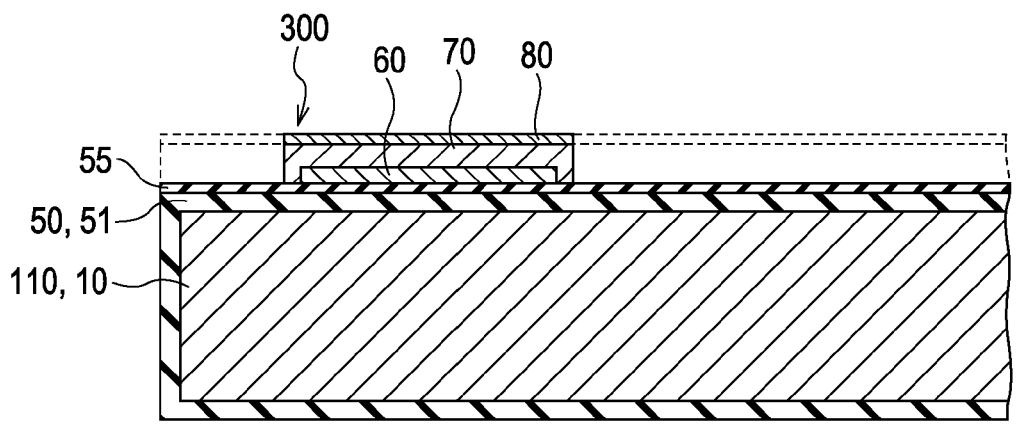

Then, as shown in FIG. 5A, a second electrode 80 is formed from iridium (Ir) or the like to cover the entire surface of the piezoelectric layer 70. Then, as shown in FIG. 5B, the piezoelectric layer 70 and the second electrode 80 are patterned to fit pressure chambers 12 to be formed later, thereby completing piezoelectric elements 300. Typical methods for patterning the piezoelectric layer 70 and the second electrode 80 include reactive ion etching, dry etching such as ion milling, and so forth.

Figure 5C:
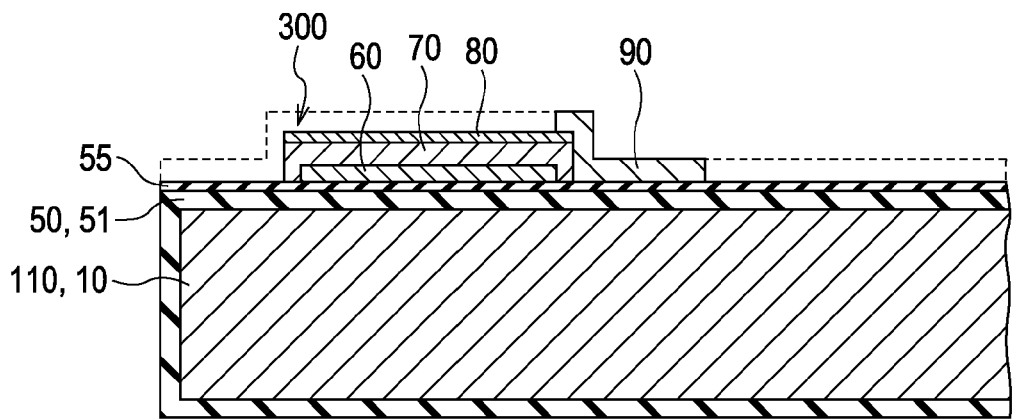

Then, lead electrodes 90 are formed. More specifically, as shown in FIG. 5C, a lead electrode 90 is formed so that the surface of the flow channel substrate wafer 110 on which the piezoelectric elements 300 exist can be completely covered, and then patterned in line with the piezoelectric elements 300 using a masking pattern made of a resist or the like (not shown in the drawing).

Figure 6A:
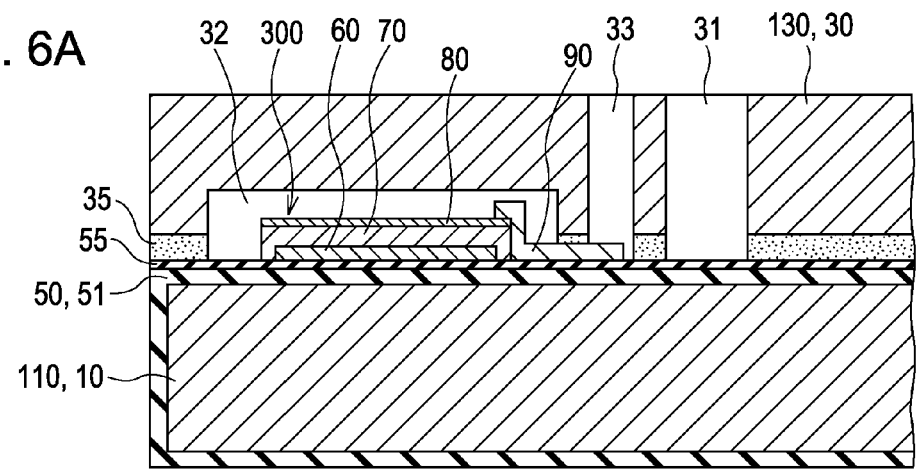

Then, as shown in FIG. 6A, a protective substrate wafer 130 is bonded with an adhesive agent 35 to the surface of the flow channel substrate wafer 110 on which the piezoelectric elements 300 exist. The protective substrate wafer 130 is a silicon wafer from which protective substrates 30 are produced.

Figure 6B:
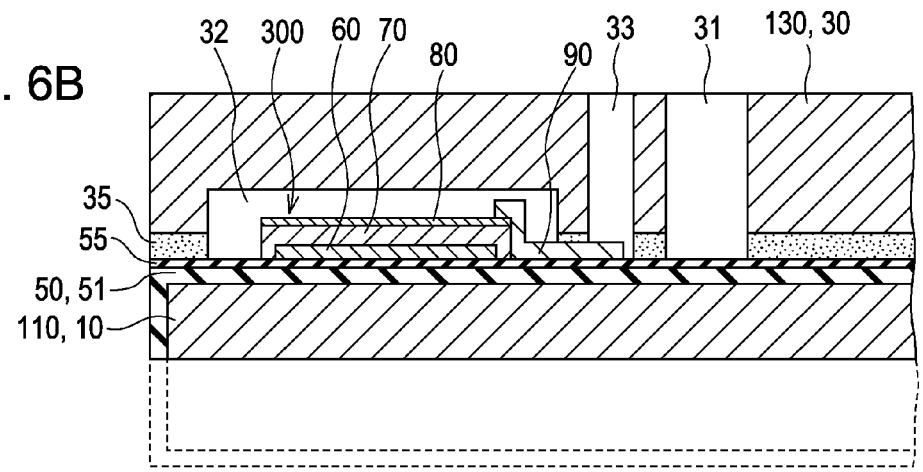
Figure 6C:
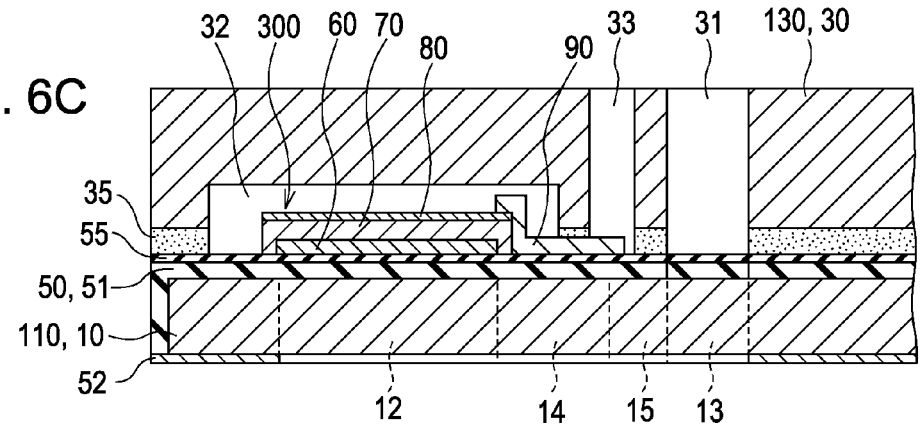
Figure 7:
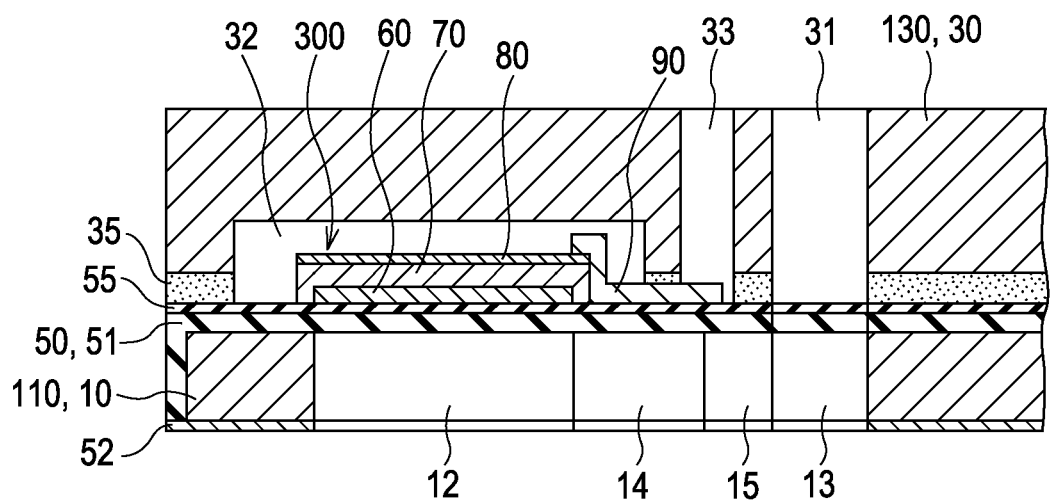

Then, as shown in FIG. 6B, the flow channel substrate wafer 110 is thinned until the thickness thereof is reduced to a given value. Then, as shown in FIG. 6C, a masking film 52 is formed on the obtained bare surface of the flow channel substrate wafer 110 and then patterned into a given shape. Then, the flow channel substrate wafer 110 is processed by anisotropic etching (wet etching) with the masking film 52 and a basic solution such as KOH, thereby forming pressure chambers 12, a communicating space 13, ink supply paths 14, communicating paths 15, and other necessary components in line with the piezoelectric elements 300.

Then, the obtained structure is diced or processed by other means so that unnecessary circumferential areas of the flow channel substrate wafer 110 and those of the protective substrate wafer 130 can be cut out. Then, a nozzle plate 20, on which nozzle openings 21 are formed in advance, is attached to the surface of the flow channel substrate wafer 110 opposite to that with the protective substrate wafer 130, and then a compliance substrate 40 is attached to the protective substrate wafer 130. Then, the obtained structure is diced into such one-size chips as that shown in FIG. 1, with a flow channel substrate 10 and other necessary components contained in each of them. In this way, ink jet recording heads are produced.

EXPERIMENTAL EXAMPLES

As experimental examples, piezoelectric elements 300 were produced under different conditions and then each assessed for carbon distribution along the thickness of the piezoelectric layer 70 and relative dielectric constant.

First, a coating solution for the piezoelectric layer 70 was prepared in accordance with the formulation specified in Table 1. Note that the raw material for Pb was more in quantity than those for Zr and Ti by 10% in mole ratio for compensation for the loss due to evaporation.

TABLE 1

| Raw materials | | Mole ratio |
|---|---|---|
| Butyl cellosolve | $C_6H_{14}O_6$ | 3 |
| Titanium isopropoxide | $Ti[OCH(CH_3)_2]_4$ | 0.44 |
| Diethanolamine | $C_4H_{11}NO_2$ | 0.65 |
| Lead acetate trihydrate | $Pb(CH_3COO)_2 \cdot 3H_2O$ | 1.1 |
| Zirconium acetylacetonate | $Zr(CH_3COCHCOCH_3)_4$ | 0.56 |
| Polyethylene glycol | $C_2H_6O_6$ | 0.5 |

The obtained solution for precursor films was analyzed by thermogravimetry, and the decomposition temperature $T_m$ thereof was 240° C.

Then, the solution for precursor films proceeded to precursor film formation, in which a silicon substrate was coated with silicon oxide to form an elastic film 50, then with zirconium oxide to form an insulating film 55, and then with platinum and iridium to form a first electrode 60. Subsequently, the solution for precursor films was applied to the first electrode 60 with the thickness of the coating left after baking set at 100 nm, and then the first drying phase was performed (heating temperature: 100° C.). Then, the second drying phase (192° C.) and defatting (400° C.) were carried out, giving a piezoelectric precursor film 71.

Precursor film formation was performed once again in the same way to form a bilayer of the piezoelectric precursor film 71, and then batch baking (700° C.) was performed to form two piezoelectric films 72. Precursor film formation was repeated twice more, and then batch baking was performed. The obtained sample, which had a piezoelectric layer 70 containing four piezoelectric films 72, was named Sample A.

Then, another sample was prepared in the same way as Sample A, except that the heating temperature for the second drying phase was 172° C. The obtained sample also had a piezoelectric layer 70 and was named Sample B. Then, another sample was prepared in the same way as Sample A, except that the heating temperature for the second drying phase was room temperature (in other words, the second drying phase was omitted). The obtained sample also had a piezoelectric layer 70 and was named Sample C.

Samples A to C were assessed by secondary ion mass spectrometry on their surface opposite to the substrate, or on their top surface, for the carbon intensity profile along the depth direction. The conditions were as follows: secondary ion mass spectrometer: sector SIMS (available from CAMECA under the trade name of IMS 4f); primary ion: Cs; acceleration energy: 14.5 kV; primary current: 10 nA; polarity of target ions: negative. Results are shown in FIG. 8.

Figure 8:
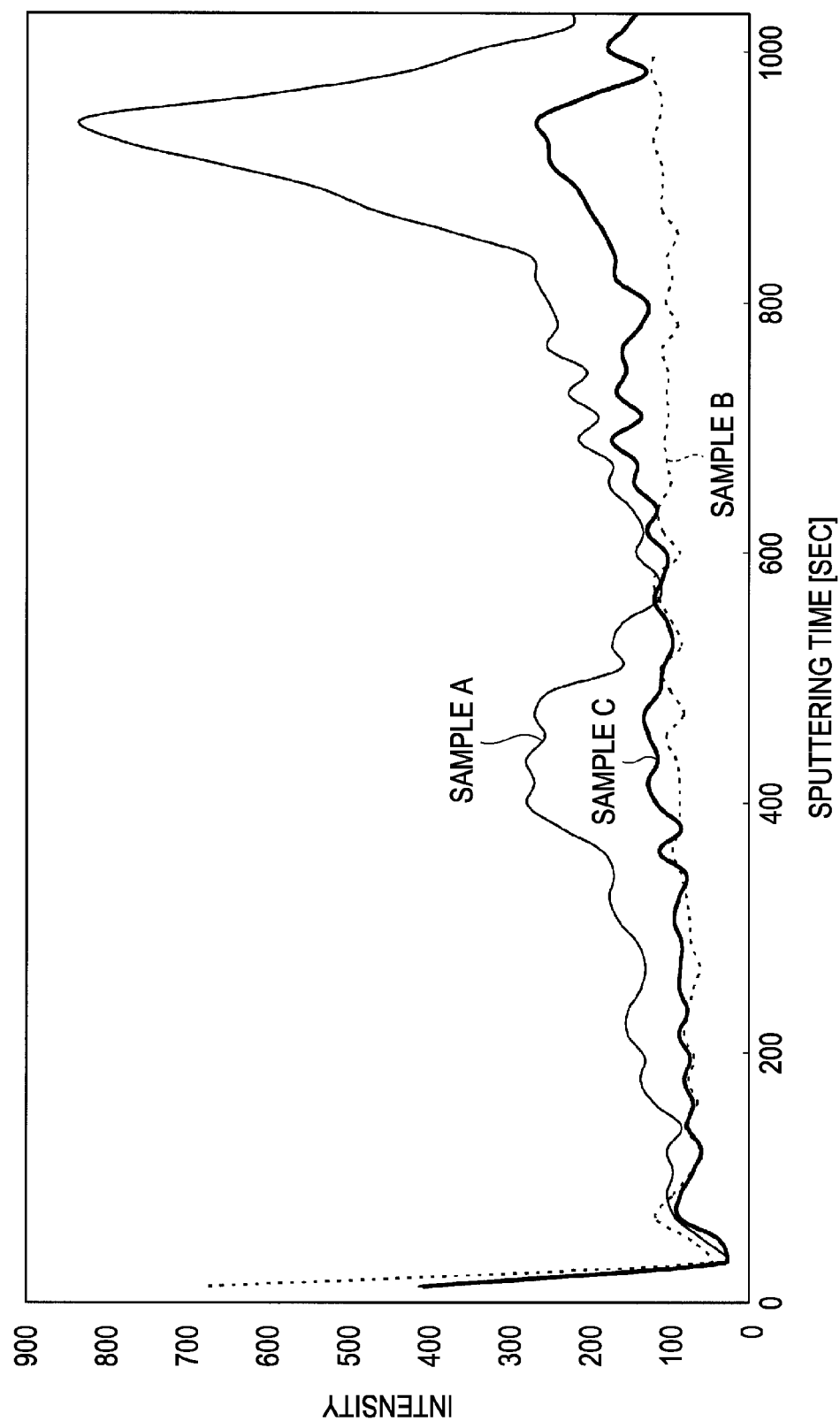
FIG. 8 is a graph showing measurements for experimental examples of an aspect of the invention.

As shown in FIG. 8, different heating temperatures for the second drying phase resulted in different carbon concentration (intensity) profiles. More specifically, the profile of Samples A and B had higher carbon intensities at depths close to the substrate, while that of Sample C showed a uniform distribution of carbon intensity. The carbon intensity ratio in the region excluding the volume that was affected by surface contamination and surface effects and offered unreliable data (the volume about 20 nm in depth from the surface) was 27.6 in Sample A, 8.22 in Sample B, and 2.49 in Sample C. Samples A and B showed two carbon intensity peaks, and these peaks corresponded to the piezoelectric films 72 first and third from the substrate. Therefore, batch baking with two piezoelectric films 72 allocates more carbon to the film closer to the substrate than to the other one.

Figure 9A:
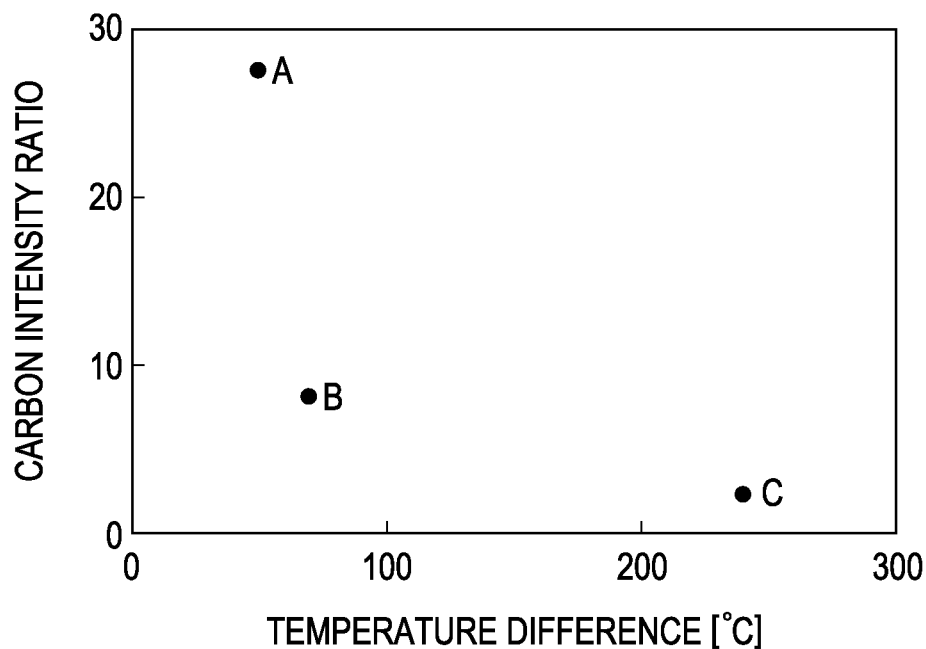
FIGS. 9A and 9B are graphs showing other measurements for the experimental examples.

FIG. 9A shows the relationship between the heating temperature for the second drying phase and the resultant carbon intensity ratio. In this drawing, Samples A to C are abbreviated as A to C, and the horizontal axis is for the difference between the decomposition temperature $T_m$ (240° C.) and the heating temperature; this difference is important in handling the relationship between the decomposition temperature $T_m$ and heat treatment in a solution. As shown in FIG. 9A, a smaller difference between the decomposition temperature $T_m$ and the heating temperature resulted in a higher carbon intensity ratio.

Figure 9B:
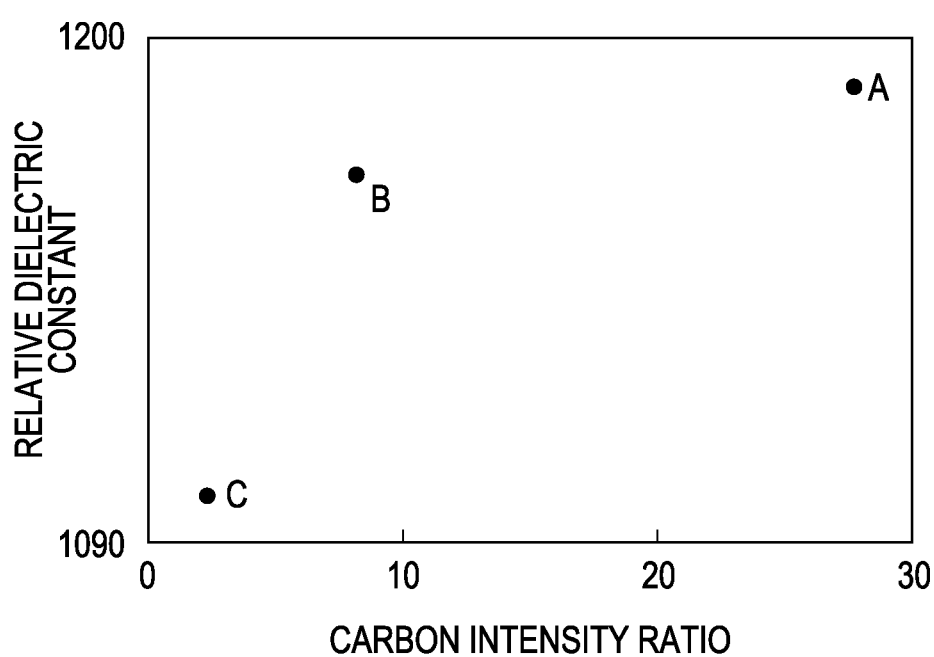

Then, Samples A to C were assessed for relative dielectric constant in TF Analyzer 2000 available from aixACCT Systems GmbH. FIG. 9B shows the relationship between the carbon intensity ratio and the relative dielectric constant observed. In this drawing, Samples A to C are abbreviated as A to C.

As shown in FIG. 9B, a higher carbon intensity ratio resulted in a higher relative dielectric constant. More specifically, the relative dielectric constant was about 1100 in Sample C, about 1170 in Sample B, seemingly jumping as the carbon intensity ratio increased, and about 1190 in Sample A, seemingly having a steady rise with further increase in carbon intensity ratio.

In summary, the carbon intensity ratio was increased by the optimization of the heating temperature for the second drying phase, and the relative dielectric constant was accordingly improved. More specifically, when the difference between the decomposition temperature $T_m$ and the heating temperature for the second drying phase was smaller than 100° C., the carbon intensity ratio was higher than 8, and the resultant relative dielectric constant gave a desired piezoelectric constant; a difference of smaller than 70° C. gave a more satisfactory result, with the carbon intensity ratio much higher than 8.

Liquid Ejecting Apparatus

Such an ink jet recording head I serves as a component of a recording head unit equipped with an ink path communicating with an ink cartridge or the like, and this recording head unit can be mounted in an ink jet recording apparatus. FIG. 10 is a schematic diagram showing a typical ink jet recording apparatus.

In the ink jet recording apparatus II shown in FIG. 10, recording head units 1A and 1B, each having an ink jet recording head I, are equipped with detachable cartridges 2A and 2B serving as ink sources. A carriage 3 carries the recording head units 1A and 1B and can freely move along a carriage shaft 5 built in a main unit 4. In a possible configuration, the recording head units 1A and 1B discharge a black ink composition and a color ink composition, respectively.

A motor 6 is driven, and the generated force is transmitted via gears (not shown in the drawing) and a timing belt 7 to the carriage 3; as a result, the carriage 3 moves along the carriage shaft 5. Recording sheets S, which are sheets of paper or some other recording medium, are fed via a sheet-feeding roller (not shown in the drawing) and then transported by a platen 8. The platen 8 is built in the main unit 4, extending along the carriage shaft 5.

Other Embodiments

In the above-described embodiment, the optimization of the difference between the decomposition temperature and the heating temperature for the second drying phase allowed the resultant piezoelectric layer 70 to have a desired relative dielectric constant. In fact, such a phase, which involves heating temperature optimization, may be any other heating phase as long as it is the heating phase second from baking. For example, when drying consists of four phases, the heating temperature for the third drying phase is adjusted for an optimized difference from the decomposition temperature.

The piezoelectric layer 70 may be a monolayer instead of containing several films as in the above-described embodiment. Even when the piezoelectric layer 70 is a monolayer, the maximum carbon intensity is still found at a depth close to the first electrode 60, whereas the minimum at a depth close to the second electrodes 80, and thus the carbon intensity ratio can still be controlled to fall within the range specified above.

Also, batch baking in the above-described embodiment may be replaced with sequential baking, in which piezoelectric precursor films 71 are sequentially baked to form piezoelectric films 72 one by one instead of being simultaneously baked.

Furthermore, the flow channel substrate 10 is not necessarily a silicon single crystal substrate; SOI, glass, and other materials can be used as the material for the flow channel substrate 10.

Although the above-described embodiment deals with an ink jet recording head as a typical liquid ejecting head, an aspect of the invention covers various kinds of liquid ejecting heads and, of course, can be applied also to liquid ejecting heads for liquids other than ink. Other applicable liquid ejecting heads include recording heads for printers or other kinds of image recording apparatus, colorant ejecting heads for manufacturing of liquid crystal displays or other kinds of color filters, electrode material ejecting heads for forming electrodes for organic EL displays, field emission displays (FEDs), or the like, bioorganic substance ejecting heads for manufacturing of biochips, and so forth.

Furthermore, an aspect of the invention can be applied not only to manufacturing methods of piezoelectric elements for liquid ejecting heads such as ink jet recording heads, but also to those of piezoelectric elements for other kinds of apparatus.

What is claimed is:

1. A liquid ejecting head, comprising:
   a pressure chamber communicating with a nozzle opening for liquid ejection; and
   a piezoelectric element having a first electrode, a piezoelectric layer above the first electrode consisting of a perovskite oxide containing lead, zirconium, and titanium, and a second electrode above the piezoelectric layer, wherein:
   the piezoelectric layer has a carbon intensity ratio, which is defined as a ratio of a maximum carbon intensity to a minimum carbon intensity as measured by secondary ion mass spectrometry along the thickness of the piezoelectric layer, in the range of 8 to 28 along the thickness of the piezoelectric layer excluding the volume 20 nm in depth from the second electrode side.

2. The liquid ejecting head according to claim 1, wherein:
   the maximum carbon intensity is found at a depth close to the first electrode with respect to the thickness of the piezoelectric layer, whereas the minimum carbon intensity is found at a depth close to the second electrode.

3. The liquid ejecting head according to claim 1, wherein the piezoelectric layer is formed by a sol-gel method.

4. A liquid ejecting apparatus comprising:
   a liquid ejecting head including:
   a pressure chamber communicating with a nozzle opening for liquid ejection; and
   a piezoelectric element having a first electrode, a piezoelectric layer above the first electrode consisting of a perovskite oxide containing lead, zirconium, and titanium, and a second electrode above the piezoelectric layer, wherein:
   the piezoelectric layer has a carbon intensity ratio, which is defined as a ratio of a maximum carbon intensity to a minimum carbon intensity as measured by secondary ion mass spectrometry along the thickness of the piezoelectric layer, in the range of 8 to 28 along the thickness of the piezoelectric layer excluding the volume 20 nm in depth from the second electrode side.

5. The liquid ejecting apparatus according to claim 4, wherein:
the maximum carbon intensity is found at a depth close to the first electrode with respect to the thickness of the piezoelectric layer, whereas the minimum carbon intensity is found at a depth close to the second electrode.

6. The liquid ejecting apparatus according to claim 4, wherein the piezoelectric layer is formed by a sol-gel method.

7. A piezoelectric element, comprising:
a first electrode;
above the first electrode consisting of a perovskite oxide containing lead, zirconium, and titanium; and
a second electrode above the piezoelectric layer, wherein:
the piezoelectric layer has a carbon intensity ratio, which is defined as a ratio of a maximum carbon intensity to a minimum carbon intensity as measured by secondary ion mass spectrometry along the thickness of the piezoelectric layer, in the range of 8 to 28 along the thickness of the piezoelectric layer excluding the volume 20 nm in depth from the second electrode side.

* * * * *